(12) United States Patent
Ramos

(10) Patent No.: US 12,228,169 B2
(45) Date of Patent: Feb. 18, 2025

(54) SYSTEM AND METHOD FOR MOUNTING A PANEL TO AN ELECTRICAL CABINET

(71) Applicant: ELDON GROUP, Madrid (ES)

(72) Inventor: David Ramos, Madrid (ES)

(73) Assignee: Hoffman Enclosures, Inc., Anoka, MN (US)

( * ) Notice: Subject to any disclaimer, the term of this patent is extended or adjusted under 35 U.S.C. 154(b) by 498 days.

(21) Appl. No.: 17/436,837

(22) PCT Filed: Mar. 9, 2020

(86) PCT No.: PCT/EP2020/056269
§ 371 (c)(1),
(2) Date: Sep. 7, 2021

(87) PCT Pub. No.: WO2020/178458
PCT Pub. Date: Sep. 10, 2020

(65) Prior Publication Data
US 2022/0183178 A1   Jun. 9, 2022

(30) Foreign Application Priority Data

Mar. 7, 2019 (EP) .................................... 19161298

(51) Int. Cl.
*F16B 19/10* (2006.01)
*F16B 5/06* (2006.01)
(Continued)

(52) U.S. Cl.
CPC .............. *F16B 5/0642* (2013.01); *F16B 5/12* (2013.01); *F16B 19/1081* (2013.01);
(Continued)

(58) Field of Classification Search
CPC ......... H05K 7/18; F16B 5/12; F16B 19/1081; F16B 5/123; F16B 5/0642; F16B 21/02;
(Continued)

(56) References Cited

U.S. PATENT DOCUMENTS 3,875,843 A * 4/1975 Maeda ................ F16B 19/1081
411/548
4,276,806 A * 7/1981 Morel ................ F16B 19/1081
411/41

(Continued)

FOREIGN PATENT DOCUMENTS

EP          0825697 A2    2/1998
WO    WO-2017144570 A1 *  8/2017

*Primary Examiner* — Kimberley S Wright
(74) *Attorney, Agent, or Firm* — Quarles & Brady LLP

(57) ABSTRACT

Systems and methods for mounting a panel to a wiring cabinet are provided. The wiring cabinet can include a frame profile with a frame profile opening and the panel can have a panel opening. A fastening element used to mount the panel to the wiring cabinet can include an expanding rivet with an opening and at least two rivet legs. The expanding rivet can be received through the panel opening and the frame profile opening when aligned. The fastener can also include an expanding body that can be inserted into the opening of the expanding rivet so that the rivet legs are forced apart to cause the rivet legs to engage the frame profile.

12 Claims, 5 Drawing Sheets

(51) Int. Cl.
*F16B 5/12* (2006.01)
*F16B 19/04* (2006.01)
*F16B 21/00* (2006.01)
*F16B 21/08* (2006.01)
*H05K 7/18* (2006.01)
*H02B 1/01* (2006.01)
*H02B 1/30* (2006.01)

(52) U.S. Cl.
CPC ............ *F16B 21/086* (2013.01); *H05K 7/18* (2013.01); *H02B 1/012* (2013.01); *H02B 1/301* (2013.01)

(58) Field of Classification Search
CPC .............................. F16B 21/04; F16B 21/086; F16B 2005/0671; F16B 5/065; Y10T 24/309; Y10T 24/42
See application file for complete search history.

(56) References Cited

U.S. PATENT DOCUMENTS

| | | | | |
|---|---|---|---|---|
| 4,878,791 | A | * | 11/1989 | Kurihara ................. F16B 29/00 411/41 |
| 5,540,528 | A | * | 7/1996 | Schmidt ............. F16B 19/1081 24/297 |
| 5,584,406 | A | * | 12/1996 | Besserer ................ H02B 1/301 312/265.2 |
| 5,759,002 | A | | 6/1998 | Essenberg |
| 6,322,305 | B1 | * | 11/2001 | Bantle ................... F16B 13/126 411/48 |
| 6,685,407 | B1 | * | 2/2004 | Holzman ............ F16B 19/1081 411/908 |
| 7,014,155 | B1 | | 3/2006 | Schnabel et al. |
| 7,993,084 | B2 | * | 8/2011 | Hitchcock ........... F16B 19/1081 411/45 |
| 2007/0175648 | A1 | * | 8/2007 | Francisquini ............ H02B 1/01 174/50 |
| 2008/0031701 | A1 | * | 2/2008 | Boubtane ............ F16B 19/1081 411/80.1 |
| 2008/0056840 | A1 | * | 3/2008 | Hitchcock ........... F16B 19/1081 411/45 |
| 2013/0136559 | A1 | * | 5/2013 | Hauser .................... F16B 5/065 411/45 |

* cited by examiner

SYSTEM AND METHOD FOR MOUNTING A PANEL TO AN ELECTRICAL CABINET

CROSS-REFERENCE TO RELATED APPLICATIONS

This application represents the national stage entry of PCT International Application No. PCT/EP2020/056269, filed on Mar. 9, 2020, which claims priority to European Patent Application No. 19161298.5 filed on Mar. 7, 2019. The contents of each of these applications are fully incorporated herein by reference.

BACKGROUND

This invention relates generally to systems and methods for mounting a panel to a wiring cabinet using at least one fastening element. The wiring cabinet can comprise at least one frame profile. The panel can have an upper end and a lower end, and can also have a rear surface and a front surface.

SUMMARY

Some embodiments of the present invention can provide a timesaving method for easily mounting a panel to a wiring cabinet, including so that the panel can be easily fastened from the front side.

Some embodiments of the invention can include a method. The method can include attaching a panel to a wiring cabinet into a pre-mounted state, wherein a rear surface of the panel is in contact with a frame profile of the wiring cabinet. The method can further include fastening the panel to the wiring cabinet with a fastening element, wherein the fastening element is inserted through an opening in the panel and an opening in the frame profile, and wherein the panel is held to the frame profile by the engagement of the fastening element with the frame profile.

The fastening element can include an expanding rivet, with an opening, and an expanding body, wherein the expanding rivet has at least two rivet legs. The fastening of the panel can include inserting the expanding rivet in an insertion direction through the opening in the panel and the opening in the frame profile, and inserting the expanding body into the opening of the expanding rivet so that the rivet legs are forced apart in such a way, that the rivet legs engage the frame profile.

The present invention can provide an easier way of assembling and disassembling a panel to a wiring cabinet. The expanding rivet can be directly inserted through the opening in the panel and can automatically be in alignment with the corresponding opening in the frame profile. By removing the expanding body, the rivet legs can be retracted, thereby simplifying the disassembly of the panel from the wiring cabinet.

The expanding rivet can be inserted from the front surface of the panel. This further simplifies the assembly process for the panel, as all components and elements for fastening the panel are accessible from the front surface of the panel. In some embodiments, the expanding body can be inserted from the front surface of the panel as well.

The expanding body can be a screw. The utilization of a screw allows the expanding rivet to be more easily unfastened by unscrewing the screw and thereby retracting the rivet legs, so that they no longer engage the frame profile.

Attaching the panel to the wiring cabinet can comprise suspending the panel at its upper end from a horizontal frame element in such a way that the panel in a pre-mounted state is pivotable about an axis parallel to the horizontal frame element. In some embodiments, the panel can have at least a first fold at its upper end, wherein the horizontal frame profile has at least a second fold, wherein the first and second fold interact as tilting mechanism, so that in a pre-mounted state the panel is pivotable about the connection between the first and second fold. The weight of the panel can be supported by the frame of the wiring cabinet during the assembly of the panel, facilitating its mounting process.

The expanding rivet can be substantially round.

The expanding rivet can have a collar that radially protrudes beyond the circumference derived from the rivet legs. The collar can sit on top of the front surface of the panel when the expanding rivet is inserted through the opening in the panel and retains the expanding rivet to the panel in the insertion direction. This way the position of the rivet legs with respect to the panel and the frame profile can be specified and the assembly is facilitated.

The opening in the panel and the expanding rivet can be formed in such a way, that after insertion, the expanding rivet is held in a non-rotatable manner relative to the panel. Thus, the direction of the expansion of the rivet legs can be defined, whereby a particularly good retention of the expanding rivet on the frame profile can be achieved.

The expanding rivet can have at least one radial first protrusion, wherein the first protrusion can interact with the opening of the panel in such a way that after insertion the expanding rivet is held in a non-rotatable manner relative to the panel. This allows the orientation of the expanding rivet towards the panel to be defined more precisely.

The expanding rivet can have at least one second protrusion, which protrudes radially from the expanding rivet. After insertion of the expanding rivet through the opening in the panel and rotation around a rotational axis of the expanding rivet the second protrusion can sit below the panel. Thereby the expanding rivet can be retained to the panel in the direction opposite to the insertion direction even in an unfastened state by the second protrusion from the rear side of the panel, simplifying the assembly of the panel. Another possibility of retaining the expanding rivet in the direction opposite to the insertion direction to the panel would be a latching pin, which would be flexible and would retain the expanding rivet after insertion through the opening in the panel.

The position of the radial first protrusion and radial second protrusion can be such that an angle between the circumferential position of the first protrusion and the position of the second protrusion in regard to the rotational axis of the expanding rivet is not 0° and can be about 90°.

The opening in the panel can have a circular hole, wherein the opening can have at least one recess radial to the circular hole, through which the second protrusion can be inserted while inserting the expanding rivet through the opening in the panel. The expanding rivet can then be rotated until the first protrusion intersects with and snaps into the recess of the opening in the panel in such a way that the expanding rivet is held in a fixated manner relative to the panel by the second protrusion. The collar can retain the expanding rivet to the panel in the insertion direction and in the opposite direction. The first protrusion can sit inside the recess to retain rotational movement of the expanding rivet. This embodiment can be suitable for the aforementioned embodiment of the expanding rivet and can allow an alternative use of the opening for other standardized fastening elements. Further, this way the expanding rivet can be retained to the panel even in an unfastened state and hence can be preassembled with the panel to facilitate the assembly for the costumer.

The expanding rivet can have at least two recesses inside the collar of the expanding rivet. These recesses can have an angle between their circumferential position in regard to the rotational axis of the expanding rivet of 180° and can be reached from the insertion direction to apply a tool to the two recesses to generate torque around the rotational axis of the expanding rivet. This way the expanding rivet can be assembled more easily, especially in regard to the aforementioned embodiment, where a rotation around the rotational axis of the expanding rivet is necessary for an easy assembly of the expanding rivet to the panel. The recesses can be formed in a way that a standard slotted screwdriver can be inserted into the recesses and can be used to apply torque onto the expanding rivet.

The opening in the frame profile can be non-circular.

The opening in the frame profile can be elongated in a first direction, and wherein after insertion, the expanding rivet can be held in a non-rotatable manner relative to the panel and the frame profile, so that upon insertion of the expanding body the rivet legs can be forced apart in a direction perpendicular to the first direction. Thereby a particularly good retention of the expanding rivet on the frame profile can be achieved.

The front surface of the panel can have an indentation concentric to the opening in the panel, wherein the indentation can be shaped in such a way that the expanding rivet with the expanding body are flush with the front surface of the panel after insertion. This allows the cabinet to be placed directly against other vertical surfaces.

The indentation can be conical, wherein the expanding rivet can have a conical collar for supporting the expanding rivet in the indentation, wherein the expanding body can have a conical headpiece, and wherein the indentation and the collar can be shaped in such a way that in combination they act as countersink for receiving the headpiece of the expanding body. This can ensure the proper alignment of the expanding rivet relative to the opening in the panel.

Some embodiments of the present invention can provide a wiring cabinet with a panel, wherein the panel is mounted to the wiring cabinet by means of at least one fastening element, wherein the wiring cabinet comprises at least one frame profile. The panel can have an upper end and a lower end, and can have a rear surface and a front surface, wherein the panel can be attached to the wiring cabinet, wherein the rear surface of the panel is in contact with the frame profile, and wherein the panel is fastened to the wiring cabinet by means of the fastening element. The fastening element can be inserted through an opening in the panel and an opening in the frame profile, wherein the panel is held to the frame profile by the engagement of the fastening element with the frame profile.

The fastening element can comprise an expanding rivet with an opening, and can further comprise an expanding body, wherein the expanding rivet can have at least two rivet legs. The expanding rivet can be inserted from the front surface of the panel, wherein the expanding body can be inserted into the opening of the expanding rivet, and wherein rivet legs can be forced apart by the inserted expanding body in such a way, that the frame profile is engaged by the rivet legs. Thereby, the panel can be mounted to the wiring cabinet by a method described herein.

Some embodiments of the present invention can further provide an expanding rivet for such a wiring cabinet, wherein the expanding rivet can be round and can have retaining elements, which fixate the expanding rivet after insertion through the opening in the panel in the insertion direction and in the opposite direction and retain rotational movement of the expanding rivet around the rotational axis of the expanding rivet in regard to the panel. Further, the expanding rivet can have at least two recesses inside the collar of the expanding rivet, which can have an angle between their circumferential positions in regard to the rotational axis of the expanding rivet of 180°. Thereby, the recesses can be reached from the insertion direction to apply a tool to the two recesses to generate torque around the rotational axis of the expanding rivet. This can allow a preassembly of the expanding rivet and the panel and hence facilitate the assembly for the customer.

Some embodiments of the invention can include providing a fastening element for mounting a panel to a wiring cabinet. The wiring cabinet can include at least one frame profile with a frame profile opening and the panel can have a panel opening. The fastening element can include an expanding rivet with an opening and at least two rivet legs. The expanding rivet can be configured to be received through the panel opening and the frame profile opening when aligned. An expanding body can be configured to be inserted into the opening of the expanding rivet so that the rivet legs are forced apart to cause the rivet legs to engage the frame profile. The expanding body can be a screw, and the expanding rivet can be round.

The expanding rivet can have a collar that radially protrudes beyond an outer circumference of the rivet legs, and the collar can be configured to sit on an outer surface of the panel when the expanding rivet is inserted through the panel opening. The expanding rivet can have a first protrusion extending radially outward from the collar, wherein the first protrusion can be configured to interact with a recess in the panel opening to retain the expanding rivet in a non-rotatable manner relative to the panel. The expanding rivet can have a second protrusion extending radially outward from the expanding rivet. The first protrusion and the second protrusion can be offset from each other around a circumference of the expanding rivet. The second protrusion can be configured to be received through the recess in the panel opening to engage an inner side of the panel to retain the expanding rivet within the panel opening. The collar can be configured to be seated on an indentation of the panel at the panel opening. The expanding rivet can have two first protrusions that extend radially outward from the collar, each of the first protrusions can be configured to interact with a respective recess in the panel opening to retain the expanding rivet in a non-rotatable manner relative to the panel. Further, the expanding rivet can have two second protrusions that extend radially outward from the expanding rivet, spaced axially from the collar and the first protrusions, each of the second protrusions can be configured to be received through a recess in the panel opening to engage an inner side of the panel to retain the expanding rivet within the panel opening.

Some embodiments of the invention can provide a wiring cabinet system. The wiring cabinet system can include a frame with frame profiles having a frame profile opening; a panel with an inner surface, an outer surface, and a panel opening; a fastening element including an expanding rivet and an expanding body, the expanding rivet having an opening and at least two rivet legs. The panel can be mounted to the frame by the fastening element with the inner surface of the panel in contact with the frame profile and the expanding rivet inserted from a first surface of the panel through the panel opening and the frame profile opening.

The expanding body can be inserted into the opening of the expanding rivet and the rivet legs can be forced apart by the expanding body to engage the frame profile. The frame profile opening can be non-circular.

The expanding rivet can have a first protrusion and a second protrusion. The first protrusion interacts with the panel opening to hold the expanding rivet in a non-rotatable manner relative to the panel and the second protrusion interacts with the panel to secure the expanding rivet axially within the panel opening. The expanding rivet can have a collar that radially protrudes beyond a circumference of the rivet legs and the first protrusion can extend radially outward from the collar to interact with a recess in the panel opening. The second protrusion can extend radially outward from the expanding rivet axially and circumferentially offset from the first protrusion.

The expanding rivet can have a set of recesses inside the collar, wherein at least two of the recesses inside the collar have an angle between their circumferential position in regard to a rotational axis of the expanding rivet of 180° and can be configured to receive a tool to generate torque around the rotational axis of the expanding rivet.

The frame profile opening can be elongated in a first direction, and upon insertion of the expanding body the rivet legs are forced apart in a direction perpendicular to the first direction.

The outer surface of the panel can have an indentation concentric to the panel opening, wherein the indentation can be shaped to receive the expanding rivet and the expanding body in a manner flush with the outer surface of the panel after insertion.

The panel can have an upper end with a first fold and the frame can have a horizontal frame element with a second fold. The first fold and the second fold can combine to form a tilting mechanism when the upper end is placed on the horizontal frame element, so that in a pre-mounted state the panel is supported by the frame and pivotable relative to the tilting mechanism.

Some embodiments of the invention can provide a method for mounting a panel to a wiring cabinet. The method can include attaching the panel to the wiring cabinet in a pre-mounted state, with a rear surface of the panel adjacent a frame profile of the wiring cabinet; and using at least one fastening element, fastening the panel to the wiring cabinet by inserting the fastening element through an opening in the panel and through an opening in the frame profile. The fastening element can include an expanding rivet and an expanding body, the expanding rivet having an opening and at least two rivet legs. The fastening of the panel to the wiring cabinet can include inserting the expanding rivet in an insertion direction through the opening in the panel and the opening in the frame profile and inserting the expanding body into the opening of the expanding rivet so that the rivet legs are forced apart to engage the frame profile at the opening therein. The expanding rivet can have at least one radial first protrusion, wherein the radial first protrusion interacts with the opening in the panel in such a way that, after insertion, the expanding rivet is held in a non-rotatable manner relative to the panel. The expanding rivet can also have at least one second protrusion, which protrudes radially from the expanding rivet, wherein after insertion of the expanding rivet through the opening in the panel and rotation around a rotational axis of the expanding rivet, the second protrusion can sit behind the panel and retain the expanding rivet to the panel in a direction opposite the insertion direction.

BRIEF DESCRIPTION OF THE DRAWINGS

An example of the execution of this invention is explained in detail in the following drawings.

DETAILED DESCRIPTION

Figure 1:
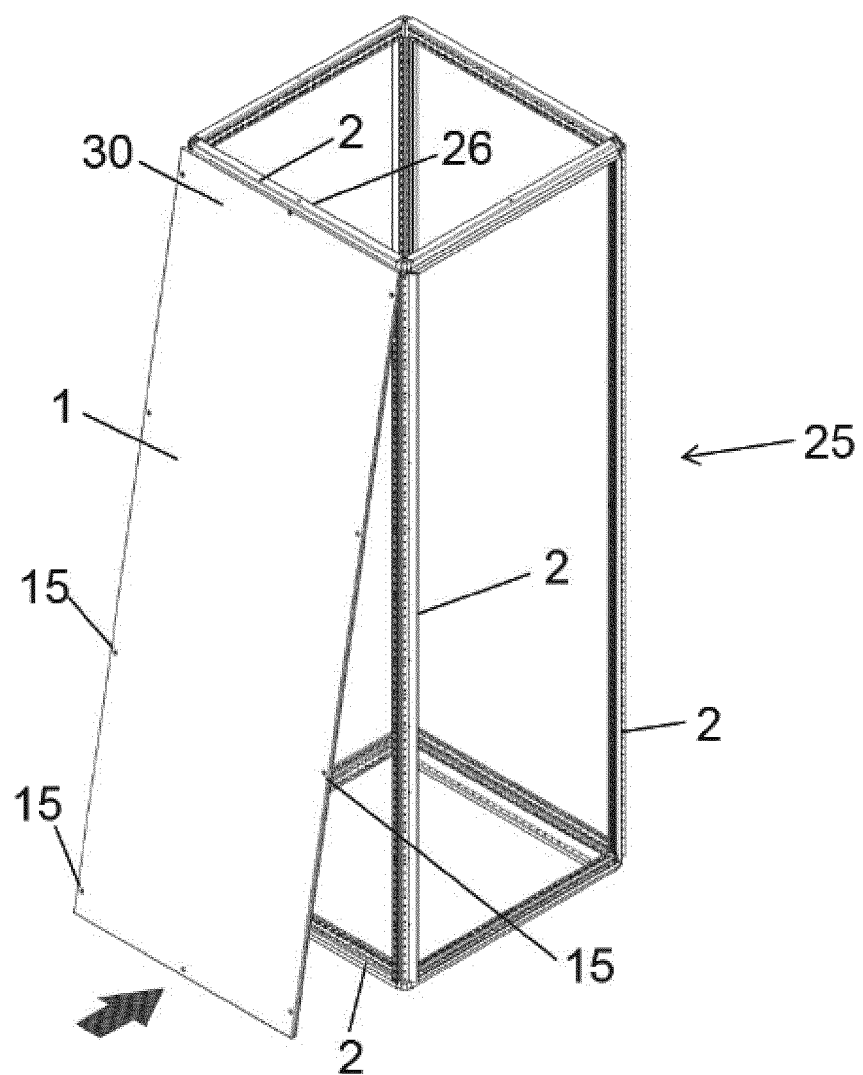
FIG. 1 shows an isometric view of a wiring cabinet with a panel.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

As used herein, unless otherwise defined or limited, directional terms are used for convenience of reference for discussion of particular figures or examples. For example, references to downward (or other) directions may be used to discuss aspects of a particular example or figure, but do not necessarily require similar orientation or geometry in all installations or configurations.

In the following description, the same parts are designated by the same reference signs. If a Figure contains reference signs that are not described in more detail in the corresponding description of the Figure, reference is made to preceding or subsequent descriptions of the Figure.

As used herein in the context of geometric descriptions, unless otherwise limited or defined, "substantially" indicates correspondence to a particular shape or dimension within conventional manufacturing tolerances for components of a similar type or that are formed using similar processes. In this regard, for example, "substantially round" can indicate a profile that deviates from a circle to within acceptable manufacturing tolerances.

Also as used herein, unless otherwise limited or defined, "wiring cabinet" generally refers to an enclosure that can house various electrical or electronic components.

In typical installations, a panel is mounted to a wiring cabinet by means of a screw, wherein the screw is retained by a clip nut or a cage nut. The nut is thereby substantially on the rear side of the frame profile, and therefore has to be mounted to the frame profile in advance of attaching the panel. Systems of this type involve a series of laborious assembly steps, as all nuts required for mounting a panel are required to be in the precise location on the frame profile. The commonly used rows of holes in the frame profiles thereby impede the proper alignment of the nuts with the corresponding openings in the panel in advance of attaching the panel.

FIG. 1 shows a panel 1 in the process of being attached to a wiring cabinet 25, which comprises several frame profiles 2. The panel 1 is thereby suspended at an upper end 30 from a horizontal frame element 26 of the wiring cabinet 25 and subsequently pivoted into a vertical orientation, which corresponds to a mounted position of the panel 1. The panel 1 further has several openings 15 for attaching the panel 1 to the frame profiles 2. Although embodiments of the invention can be suitably used, in particular, with a cabinet similar to the cabinet 25 and with panels and frame profiles similar to the panel 1 and the frame profiles 2, some embodiments can also be used with other types of cabinets and other types of panels and frame profiles.

Figure 2:
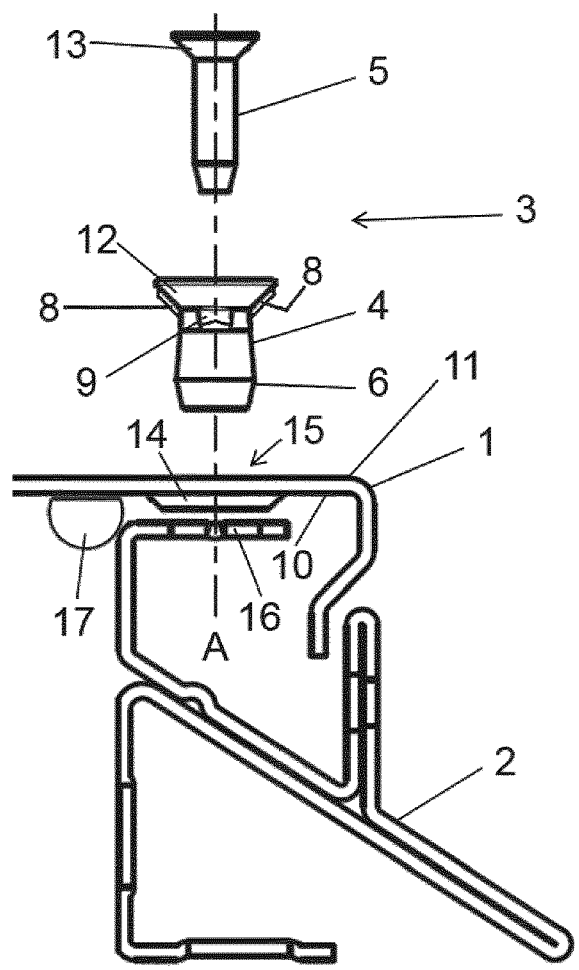
FIG. 2 shows an exploded view of an embodiment of a fastener arrangement for fastening the panel to a frame of the wiring cabinet of FIG. 1.

FIG. 2 shows a fastening element 3 utilized for attaching the panel 1 to one of the frame profiles 2, with a rear surface 10 of the panel 1 facing the frame profile 2. The fastening element 3 comprises an expanding rivet 4 and an expanding body (e.g., a screw 5). In the illustrated embodiment, the expanding rivet 4 is substantially round, although other geometries are possible. For fastening the panel 1 to the frame profile 2, the substantially round expanding rivet 4 is inserted through an opening 15 in the panel 1, which is aligned with an opening 16 in the frame profile 2, so that the expanding rivet 4 is also inserted through the frame opening 16.

The panel opening 15 is within a concentric conical indentation 14, which is shaped suitably to receive a conical collar 12 of the expanding rivet 4. The collar 12 thereby acts as a countersink for receiving a conical headpiece 13 of the screw 5, so that in a completely mounted state the headpiece 13 of the screw 5 is flush with a front surface 11 of the panel 1. In some embodiments, however, a headpiece may not necessarily be flush with a front surface of a panel. For example, in some cases, a headpiece of a screw may be recessed below a front surface of a panel.

By inserting the screw 5 into the expanding rivet 4, the rivet legs 6 are being forced apart in such a way that the rivet legs 6 engage the frame profile 2, thereby retaining the panel 1 to the frame profile 2.

In some embodiments, a gasket or other sealing element can be included. For example, the panel 1 further has a gasket 17 installed along the edges of the panel 1, wherein the gasket 17 can be compressed against the frame profile 2 by fastening the panel 1 to the frame profile 2. The gasket 17 provides a seal between the frame profile 2 and the panel 1.

In some embodiments, further features can help an expanding rivet to secure a panel. For example, the expanding rivet 4 has two radial first protrusions 8, which extend along the collar 12. In the illustrated embodiment, the protrusions 8 extend from close to a main body of the expanding rivet 4 to close to the outer edge of the collar 12 and have a face parallel to the collar 12 and the conical indentation 14, although other configurations are possible.

In particular, the two first protrusions 8 have an angle between their circumferential positions in regard to a rotational axis (illustrated by section line A in FIG. 2) of the expanding rivet 4 of 180°. In other words, a first set of protrusions on a collar of a rivet can be spaced apart along a circumference of the collar. Further, the expanding rivet 4 has two second protrusions 9, which also have an angle between their circumferential positions in regard to the rotational axis of the expanding rivet 4 of 180° and their positions are turned 90° around the rotational axis of the expanding rivet 4 in regard to the positions of the two first protrusions 8. In other words, a second set of protrusions on a collar of a rivet can be spaced apart from each other, and from a first set of protrusions on the collar, along a circumference of the collar (e.g., can be spaced evenly between protrusions of the first set).

Figure 3:
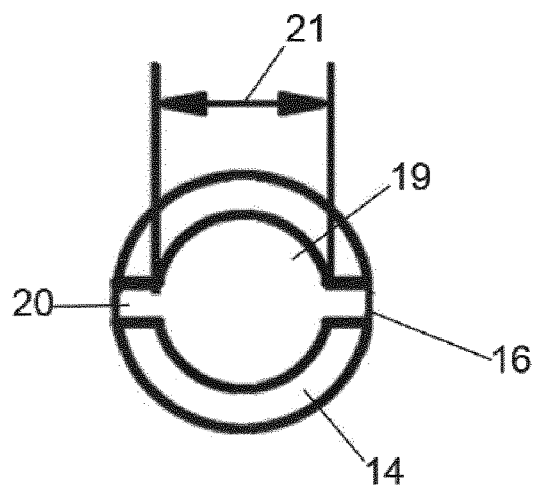
FIG. 3 shows a detailed view of an embodiment of an opening in the panel of FIG. 1 for receiving a fastening element.

The panel opening 15, as shown in FIG. 3, comprises a circular hole 19, which is concentric to the indentation 14. Further, the opening 15 has two radial recesses 20 for passing the second protrusions 9 through the panel 1 and receiving the first protrusions 8 of the expanding rivet 4. The radial recesses 20 thereby extend in a first direction 21 to the outer edge of the indentation 14. Accordingly, the second protrusions 9 can be passed through the radial recesses 20 and the expanding rivet 4 can then be rotated (e.g., by a flat-blade screwdriver or other manual tool), which can engage a slot drive or other feature incorporated in the conical collar 12 of the expanding rivet 4. With sufficient rotation, the second protrusions 9 can engage the rear surface (i.e., interior side) of the indentation 14, and the collar 12 can engage the front surface (i.e., the exterior side) of the indentation 14 and thereby retain the expanding rivet 4 on the panel 1.

In some embodiments, the rotation of the expanding rivet 4 can be performed until the first protrusions 8 snap into the radial recesses 20 to then hold the expanding rivet 4 in a non-rotatable manner relative to the panel 1. Hence, a fixation of the expanding rivet 4 relative to panel 1 is attained, with the second protrusions 9 securing the expanding rivet 4 against being withdrawn and the first protrusions 8 securing the expanding rivet 4 against rotation. In some cases, this fixation can be particularly effective if the distance between the position of the first protrusion 8 to the second protrusion 9 alongside the insertion direction is smaller than the thickness of the panel 1. Correspondingly, with the material of the expanding rivet 4, the first protrusions 8, and the second protrusions 9 being slightly flexible, resilient deformation of the expanding rivet 4 generally can allow the rotation and then fixation of the expanding rivet 4 while the first protrusions 8 are pressing against the front surface of the indentation 14 and the second protrusions 9 are pressing against the rear surface 10 of the panel 1, until the first protrusions 8 snap into the recesses 20.

In some cases, with the orientation of the panel 1 relative to the frame profile 2 being fixed, the expanding rivet 4 can also be fixed relative to the frame profile 2.

Figure 4A:
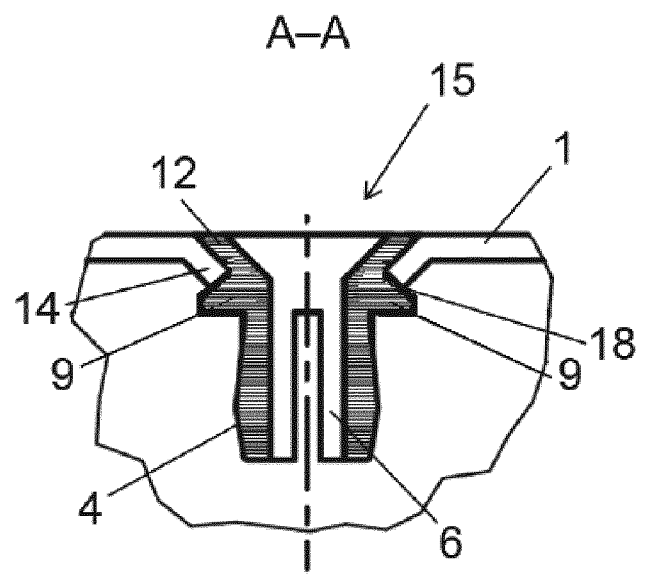
FIG. 4a shows a cross-sectional view of an embodiment of a fastening element for fastening the panel of FIG. 1 taken along section line A-A of FIG. 2.

FIG. 4a shows in detail the expanding rivet 4 with its two second protrusions 9 after it has been inserted through opening 15 and turned to its final position relative to panel 1. FIG. 4a is a cross-sectional view of the expanding rivet 4 with the panel 1 along the section line A-A shown in FIG. 2. The second protrusions 9 thereby engage the panel 1, so that the expanding rivet 4 is retained to the panel 1. In particular, as also discussed above, the second protrusions 9 interlock with the inner edge 18 of the panel opening 15, which is tilted somewhat inwards (i.e., downwards from the illustrated perspective) by the indentation 14. In some cases, this inwardly angled profile, as provided by an indentation, can provide improved grip by protrusions of a rivet.

Figure 4B:
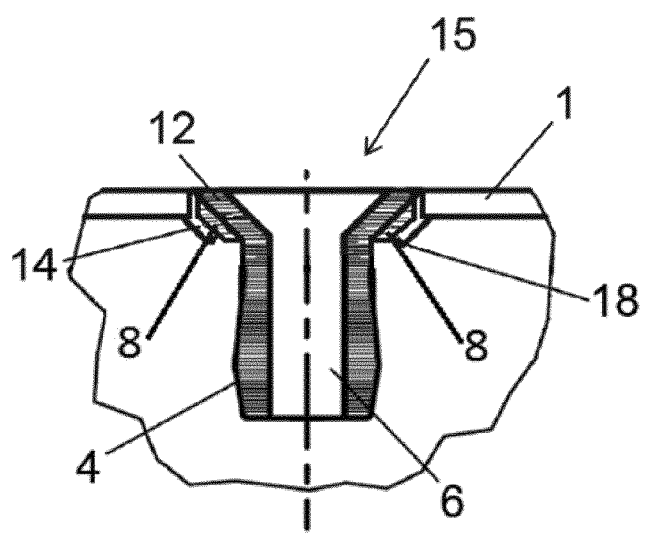
FIG. 4b shows a cross-sectional view of the fastening element of FIG. 4a from a view turned 90° around a rotational axis.

FIG. 4b shows in detail the expanding rivet 4 with its two first protrusions 8, after it has been inserted through opening 15 and turned to its final position relative to panel 1 and the first protrusions 8 have snapped into the radial recesses 20 of the opening 15. In particular, the illustrated perspective is rotated 90° in regard to the cross-sectional view shown in FIG. 4a. The first protrusions 8 sit inside the radial recesses 20 and are locked between the indentations 14 in the rotational direction of the expanding rivet 4. Thereby, the expanding rivet 4 is retained non-rotatably in regard to the panel 1.

In some cases, an expanding rivet can be inserted into a panel opening before attaching the panel to a wiring cabinet. For example, with a configuration as shown in FIGS. 4a and 4b, the expanding rivet 4 can be securely retained to the panel 1 by the second protrusion 9 and the collar 12, including as the panel 1 is moved into alignment with a particular frame member. Correspondingly, the rivet 4 can be subsequently inserted through the relevant frame opening 16 upon attaching the panel 1 to the wiring cabinet 25.

Figure 5:
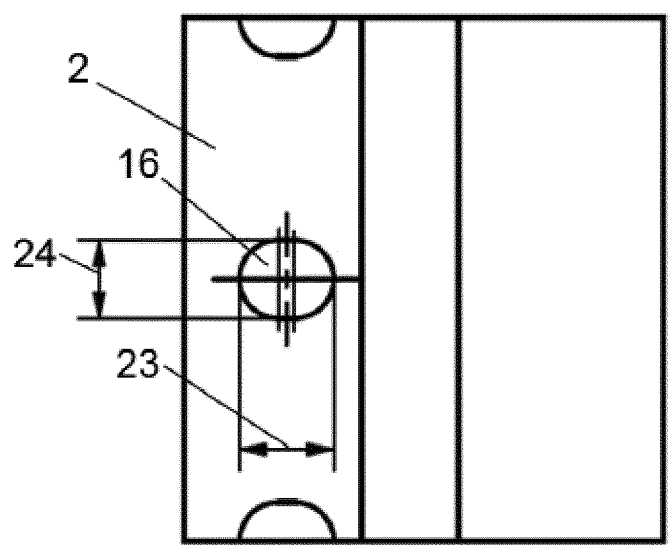
FIG. 5 shows a detailed view of an embodiment of an opening in the frame of FIG. 1 for receiving the fastening element.

In different embodiments, different frame openings can be used and rivets can be differently aligned relative to the frame openings to secure a panel to a corresponding frame member. For example, as shown in FIG. 5, the frame opening 16 is non-circular, being elongated in a first direction 23. Correspondingly, in some cases, the panel 1 can be arranged so that the direction 21 of the recesses 20 (see FIG. 3) corresponds to the first direction 23. Due to the interaction of the first protrusions 8 and the recesses 20, the expanding rivet 4 (not shown in FIG. 5) can thereby be aligned with respect to the frame opening 16 in such a way that the rivet legs 6, upon insertion of the screw 5 through the expanding rivet 4, can be forced apart in a second direction 24, which is orthogonal to the first direction 23, so that the rivet legs 6 expand beyond the width of the frame opening. Thus, the expanding rivet 4 can be easily retained within the panel 1 to be inserted into the frame opening 16, and then easily expanded to secure the panel 1 to the frame profile 2 at the frame opening 16.

Figure 6:
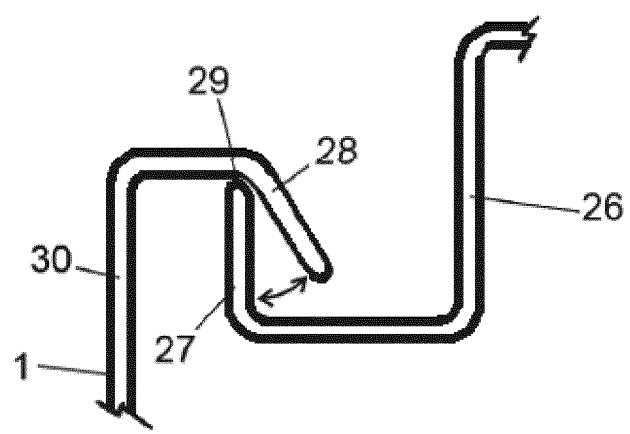
FIG. 6 shows a detailed view of an embodiment of a connection between the panel and a frame of the wiring cabinet of FIG. 1.

In different embodiments, as also noted above, different types of frame profiles can be used. As shown in FIG. 6, for example, an upper end 30 of the panel 1 (from the illustrated perspective) has a first fold 28 for attaching the panel 1 to the wiring cabinet 25, which is formed in the shape of a hook. Further, the first fold 28 is hooked into a second fold 27 of the horizontal frame element 26, which is also formed in the shape of a hook, so that the first fold 28 and the second fold 27 interact in the manner of a tilting mechanism 29. Upon suspending the panel 1 from the frame element 26, the panel 1 is therefore pivotable about the axis of the tilting mechanism 29, which is parallel to the frame element 26.

In some embodiments, a folded configuration of a panel and a frame profile can help to further streamline installation of the panel using an expanding rivet according to embodiments of the invention. For example, with a set of expanding rivets secured to a panel with a folded upper end (e.g., as with the upper end 30), the panel can be readily suspended from a fold on a horizontal frame element (e.g., as with the frame element 26) to be pivotably supported on the larger enclosure frame. The panel can then be urged pivotably towards the enclosure frame to collectively urge the expanding rivets into corresponding openings in relevant (e.g., vertical) frame members.

Figure 7:
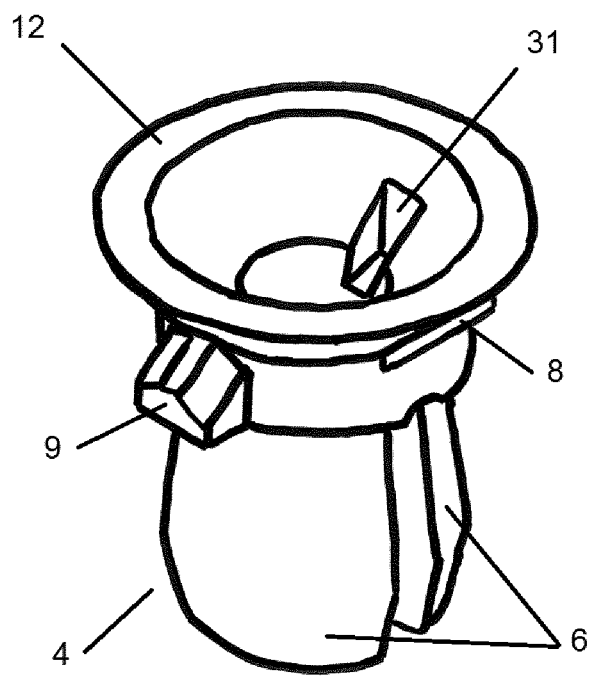
FIG. 7 shows an isometric view of an embodiment of an expanding rivet.

A detailed view of an example configuration of the expanding rivet 4 is shown in FIG. 7. In particular, the rivet legs 6 are oriented in the same direction as the second protrusions 9. Correspondingly, when the expanding rivet 4 secures the panel 1 to the frame profile 2, the frame profile 2 can also be clamped between the lower (inner) face of the second protrusions 9 and the rivet legs 6, which can enhance the grip of the expanding rivet onto the frame profile 2. Further, the top face of the second protrusions 9 is slightly angled down (i.e., away from the collar 12) to facilitate the rotation of the expanding rivet 4, when the second protrusion 9 starts to press against the indentation 14 (e.g., as also described above).

Continuing with the illustrated example, two recesses 31 for engaging a tool to generate torque around the rotational axis of the expanding rivet 4 are provided inside the collar 12 of the expanding rivet 4 and are located in the same radial direction from the rotational axis of the expanding rivet 4 as the two second protrusions 9, which can provide more room to facilitate formation of the recesses 31 inside the collar 12 due to the added material of the second protrusions 9. Further, the first protrusions 8 are positioned at a 90° offset relative to the second protrusions 9 and the recesses 31, in regard to the rotational axis of the expanding rivet 4. This configuration can facilitate the rotation of the expanding rivet 4, when the second protrusion 9 is pressing against the rear surface of the panel 1 and the first protrusion 8 is pressing against the front surface of the panel 1. Additionally, the first protrusions 8 are formed with their lower (i.e., inner) faces parallel to the collar 12. This can further facilitate the rotation of the expanding rivet 4 and lower the necessary flexibility of either the first protrusions 8, the second protrusion 9, or the collar 12, which can thereby improve the fixation of the expanding rivet 4 to the panel 1 when the expanding rivet 4 is inserted and rotated to its final position in regard to the panel 1.

The skilled person will appreciate that the invention is not limited to the above embodiment. For example, instead of the expanding rivet being inserted from the front surface of the panel, the expanding rivet could also be clipped to the panel from its rear surface before subsequently attaching the panel to the wiring cabinet and subsequently inserting the expanding body into the rivet.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A fastening element for mounting a panel to a wiring cabinet, the wiring cabinet including at least one frame profile having a frame profile opening and the panel having a panel opening, the fastening element comprising:
   an expanding rivet configured to be received through the panel opening and the frame profile opening, the expanding rivet including:
      an opening disposed through a longitudinal axis of the expanding rivet;

at least two rivet legs extending from a first end of the expanding rivet;

a collar radially protruding from a second end of the expanding rivet and having an outer circumference greater than an outer circumference of the rivet legs, the collar being configured to contact an outer surface of the panel when the expanding rivet is inserted through the panel opening, to be seated on an indentation of the panel at the panel opening;

at least two first protrusions extending radially outward from the collar of the expanding rivet opposite the first end, the first protrusions being configured to engage a respective recess of at least two recesses included in the panel opening, with the expanding rivet in a first rotational orientation, to retain the expanding rivet in a non-rotatable manner relative to the panel; and at least two second protrusions extending radially outward from the expanding rivet, the second protrusion being axially and circumferentially offset from the first protrusion to be received through the recesses in the panel opening with the expanding rivet in a second rotational orientation different from the first rotational orientation, and to engage an inner side of the panel, after being received through the recesses and upon rotation of the expanding rivet to the first rotational orientation, to axially retain the expanding rivet within the panel opening with the expanding rivet in the first rotational orientation; and an expanding body configured to be inserted into the opening of the expanding rivet to force apart the rivet legs so that the rivet legs engage the frame profile.

2. A wiring cabinet system comprising:

a frame with one or more frame profiles having a frame profile opening;

a panel with an inner surface, an outer surface, and a panel opening; and a fastening element including an expanding rivet and an expanding body, the expanding rivet including:

an opening disposed through a longitudinal axis of the expanding rivet;

at least two rivet legs extending from a first end of the expanding rivet;

a collar radially protruding from a second end of the expanding rivet opposite the first end, the collar contacting an outer surface of the panel when the expanding rivet is inserted into the panel opening;

at least two first protrusions extending radially outward from the collar, the at least two first protrusions engaging a respective recess of at least two recesses on the panel opening, with the expanding rivet in a first rotational orientation, to retain the expanding rivet in a non-rotatable manner relative to the panel; and at least two second protrusions extending radially outward from the collar, the at least two second protrusions being axially and circumferentially offset from the at least two first protrusions and being receivable through the recesses in the panel opening with the expanding rivet in a second rotational orientation different from the first rotational orientation and, with the expanding rivet in the first rotational orientation, the at least two second protrusions engaging an inner side of the panel to axially retain the expanding rivet within the panel opening; and wherein the panel is mounted to the frame by the fastening element with the inner surface of the panel in contact with the frame profile, and with the expanding rivet inserted from the outer surface of the panel through the panel opening and the frame profile opening and the expanding body inserted into the opening of the expanding rivet to force the rivet legs into engagement with the frame profile.

3. The wiring cabinet system of claim 2, wherein the at least two second protrusions are circumferentially offset from the at least two first protrusions by 90° degrees.

4. The wiring cabinet system of claim 2, wherein the frame profile opening is elongated in a first direction, and upon insertion of the expanding body the rivet legs are forced apart in a direction perpendicular to the first direction.

5. The wiring cabinet system of claim 2, wherein the outer surface of the panel further includes an indentation concentric to the panel opening, the indentation being configured to receive the fastening element so that the second end of the expanding rivet is flush with the outer surface of the panel after insertion.

6. The wiring cabinet system of claim 2, wherein the panel further includes a first fold at an upper end of the panel, wherein the frame further includes a horizontal frame element having a second fold, and wherein the first fold of the panel and the second fold of the horizontal frame element are configured to interact to form a tilting mechanism when the upper end of the panel is placed on the horizontal frame element, so that in a pre-mounted state the panel is supported by the frame and pivotable relative to the tilting mechanism.

7. A method for mounting a panel to a wiring cabinet, the method comprising:

aligning a panel with a wiring cabinet, with a rear surface of the panel adjacent a frame profile of the wiring cabinet; and fastening the panel to the wiring cabinet by:

with an expending rivet in a first rotational orientation, inserting the expanding rivet in an insertion direction through an opening in the panel and an opening in the frame profile, so that first protrusions of the expanding rivet are received through recesses of the panel opening to be disposed on an interior side of the panel;

rotating the expanding rivet from the first rotational orientation to a second rotational orientation to move the first protrusions out of alignment with the recesses and move second protrusions to be received in the recesses, so that the first protrusions engage an inner side of the panel to axially secure the expanding rivet within the panel opening and the second protrusions engage the recesses to secure the expanding rivet against rotation within the opening; and inserting an expanding body into the expanding rivet to force apart rivet legs of the expanding rivet, to secure the expanding rivet to the frame profile at the frame profile opening.

8. The method according to claim 7, further comprising:

before inserting the expanding body into the expanding rivet to secure the expanding rivet to the frame profile, hanging the panel from the wiring cabinet in a pre-mounted state.

9. The fastening element of claim 1, wherein the expanding rivet further includes two or more recesses disposed within the collar and adjacent to the opening, the two or more recesses being configured to receive a tool to generate torque around a rotational axis of the expanding rivet.

10. The fastening element of claim 9, wherein at least two of the recesses of the expanding rivet are disposed circumferentially opposite each other on the collar.

11. The fastening element of claim 10, wherein the at least two recesses of the expanding rivet are circumferentially aligned with the at least two second protrusions.

12. The wiring cabinet system of claim 2, wherein the second protrusion is axially offset from the first protrusion by less than a thickness of the panel at the panel opening.

* * * * *